United States Patent
Lee et al.

(10) Patent No.: US 7,868,321 B2
(45) Date of Patent: Jan. 11, 2011

(54) ORGANIC LIGHT EMITTING DEVICE AND FLAT DISPLAY INCLUDING THE SAME

(75) Inventors: Chang-Ho Lee, Suwon-si (KR); Seung-Gak Yang, Suwon-si (KR); Hee-Yeon Kim, Suwon-si (KR); Jung-Han Shin, Suwon-si (KR); Hee-Joo Ko, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 998 days.

(21) Appl. No.: 11/655,590

(22) Filed: Jan. 18, 2007

(65) Prior Publication Data

US 2007/0164278 A1 Jul. 19, 2007

(30) Foreign Application Priority Data

Jan. 18, 2006 (KR) ..................... 10-2006-0005410

(51) Int. Cl.
*H01L 51/54* (2006.01)
*C09K 11/06* (2006.01)

(52) U.S. Cl. .......... 257/40; 257/E51.018; 257/E51.044; 313/504

(58) Field of Classification Search ................... 257/40, 257/E51.018, E51.022, E51.043–E51.044, 257/E51.026; 428/690; 313/504; 438/99
See application file for complete search history.

(56) References Cited

U.S. PATENT DOCUMENTS

| | | | | |
|---|---|---|---|---|
| 5,940,053 | A * | 8/1999 | Ikeda | ........................... 345/77 |
| 2005/0100760 | A1 * | 5/2005 | Yokoyama | ................... 428/690 |
| 2005/0112404 | A1 | 5/2005 | Hamada et al. | |
| 2005/0129982 | A1 * | 6/2005 | Fukuoka et al. | ............. 428/690 |
| 2005/0287394 | A1 * | 12/2005 | Yang et al. | .................. 428/690 |
| 2007/0009759 | A1 | 1/2007 | Burn et al. | |
| 2007/0241669 | A1 * | 10/2007 | Liu et al. | ..................... 313/504 |

FOREIGN PATENT DOCUMENTS

| | | |
|---|---|---|
| JP | 2005-108726 | 4/2005 |
| JP | 2005-119156 | 12/2005 |
| JP | 2006-013488 | 12/2006 |

(Continued)

OTHER PUBLICATIONS

Yeh, S.-J., et al. "New Dopant and Host Materials for Blue-Light-Emitting Phosphorescent Organic Electroluminescent Devices." Adv. Mater., vol. 17 (2005): pp. 285-289.*

(Continued)

*Primary Examiner*—Matthew W Such
(74) *Attorney, Agent, or Firm*—Knobbe Martens Olson & Bear LLP (57) ABSTRACT

Provided are an organic light emitting device (OLED) and a flat display including the OLED. The OLED includes an organic layer which includes a pixel electrode, an opposite electrode, and at least an emission layer between the pixel electrode and the opposite electrode, wherein the emission layer includes a long wavelength-blue emission layer emitting blue light having a long wavelength and a short wavelength-blue emission layer emitting blue light having a short wavelength. The long wavelength-blue emission layer is positioned in a location to enhance emission of blue light from the emission layer. The OLED can emit blue light with high efficiency and high brightness.

21 Claims, 5 Drawing Sheets

DIRECTION OF LIGHT EXTRACTION

FOREIGN PATENT DOCUMENTS

| KR | 10-2001-0080488 | 8/2001 |
|---|---|---|
| KR | 10-2006-0011067 | 2/2006 |
| WO | WO 98/08360 | 2/1998 |
| WO | WO 00/18193 | 3/2000 |
| WO | WO 2001/21729 | 3/2001 |
| WO | WO 2004/101707 A | 11/2004 |

OTHER PUBLICATIONS

Lee, M.-T., et al. "Highly Efficient, Deep-Blue Doped Organic Light-Emitting Devices." Adv. Mater., vol. 17 (2005): pp. 2493- 2497.*

He G., et al. "Very High-Efficiency and Low Voltage Phosphorescent Organic Light-Emitting Diodes Based on a p-i-n. Junction." J. Appl. Phys., vol. 95 (2004): pp. 5773-5777.*

Yu, M.-X., et al. "Diaminoanthracene Derivatives as High-Performance Green Host Electroluminescent Materials." Chem. Mater., vol. 14 (2002): pp. 3958-3963.*

Laskar, I.R., et al. "Investigating Photoluminescence and Electroluminescence of Iridium(III)-Based Blue-Emitting Phosphors." Polyhedron, vol. 25 (2006): pp. 1167-1176.*

Yu, M.-X., et al. "Diaminoanthracene Derivatives as High-Performance Green Host Electroluminescent Materials." Chem. Mater., vol. 14 (2002): pp. 3958-3963.*

Shi, J. & Tang, C.W., et al. "Anthracene Derivatives for Stable Blue-Emitting Organic Electroluminescent Devices." Appl. Phys. Lett., vol. 80 (2002): pp. 3201-3203.*

O'Brien, D.F., et al. "Improved Energy Transfer in Electrophosphorescent Devices." Appl. Phys. Lett., vol. 74 (1999): pp. 442-444.*

He, G., et al. "High-Efficiency and Low-Voltage p-i-n. Electrophosphorescent Organic Light-Emitting Diodes with Double-Emission Layers." Appl. Phys. Lett., vol. 85 (2004): pp. 3911-3913.*

Tokito, S., et al. "High-Efficiency Blue and White Phosphorescent Organic Light-Emitting Devices." Curr. Appl. Phys., vol. 5 (2005): pp. 331-336.*

European Search Report (a counterpart European Application No. EP 07250194.3).

* cited by examiner

FIG. 1A

DIRECTION OF LIGHT EXTRACTION

ORGANIC LIGHT EMITTING DEVICE AND FLAT DISPLAY INCLUDING THE SAME

CROSS-REFERENCE TO RELATED APPLICATIONS

This application claims the benefit of Korean Patent Application No. 10-2006-0005410, filed on Jan. 18, 2006, in the Korean Intellectual Property Office, the disclosure of which is incorporated herein in its entirety by reference.

BACKGROUND OF THE INVENTION

1. Field

The present invention relates to an Organic Light Emitting Device (OLED) and a flat panel display including the same, and more particularly to a blue emission layer of an OLED.

2. Description of the Related Technology

Organic Light Emitting Devices (OLEDs) emit light by recombination of electrons and holes in an organic layer made of a fluorescent or phosphorescent compound when a current is applied to the organic layer. OLEDs have advantages of simple components, superior image quality, wide viewing angles, and lightweight. In addition, OLEDs are easy to fabricate. Furthermore, OLEDs can realize high quality of dynamic images and high color purities. OLEDs also have electrical properties suitable for portable electronic devices, such as low power consumption and low driving voltages.

OLEDs include an emission layer (EML) including a light emitting organic material. OLEDs may also include additional layers to improve efficiency and to reduce driving voltages. Examples of such additional layers include, but are not limited to, an electron injection layer (EIL), an electron transport layer (ETL), a hole transport layer (HTL), and a hole injection layer (HIL). For example, an OLED including an HTL is disclosed in Japanese Patent Application Publication No. 2002-252089.

Full color OLEDs include an EML which can emit red light, green light and blue light. Here, blue EMLs have relatively low efficiency and low brightness compared with red EMLs and green EMLs. Accordingly, improving efficiency and brightness of blue EMLs is a very important issue for improving performance of OLEDs and characteristics such as power consumption. Therefore, there is a need to provide blue EMLs having improved brightness and efficiency.

SUMMARY OF CERTAIN INVENTIVE ASPECTS

One aspect of the invention provides an organic light emitting device. The device comprises: a first electrode comprising a substantially transparent conductor; a second electrode; a first blue emission layer interposed between the first and second electrodes, the first blue emission layer comprising a first compound configured to emit blue light having a first maximum emission wavelength; and a second blue emission layer interposed between the first blue emission layer and the second electrode, the second blue emission layer comprising a second compound configured to emit blue light having a second maximum emission wavelength, the second maximum emission wavelength being shorter than the first maximum emission wavelength.

The first electrode may comprise an anode electrode, and the second electrode may comprise a cathode electrode, the second electrode comprising a reflective conductor. The first electrode may comprise a cathode electrode, and the second electrode may comprise an anode electrode, the second electrode comprising a reflective conductor.

The second electrode may comprise a substantially transparent conductor, and the device may further comprise a third blue emission layer interposed between the second electrode and the second blue emission layer, the third blue emission layer comprising a third compound configured to emit blue light having a third maximum emission wavelength, the third maximum emission wavelength being longer than the second maximum emission wavelength. The third maximum emission wavelength may be substantially the same as the first maximum emission wavelength. The third blue emission layer may comprise the first compound.

The first maximum emission wavelength may be between about 470 nm and about 500 nm. The second maximum emission wavelength may be between about 440 nm and about 470 nm. The first blue emission layer may have a thickness between about 5 nm and about 250 nm. The second blue emission layer may have a thickness between about 5 nm and about 250 nm.

The first blue emission layer may comprise at least one material selected from the group consisting of tetra(t-butyl)perylene and bis(4,6-difluorophenyl-pyridine)iridium picolinate (FIrpic). The second blue emission layer may comprise at least one material selected from the group consisting of anthracenediphenylamine, the compound represented by Formula 1 and the compound represented by Formula 2:

Formula 1

Formula 2

The device may further comprise at least one layer interposed between the first electrode and the second electrode, the at least one layer being selected from the group consisting of a hole injection layer, a hole transport layer, an electron blocking layer, a hole blocking layer, an electron transport layer and an electron injection layer.

Each of the first and second blue emission layers may be configured to emit light having a wavelength between about 400 nm and about 600 nm. Each of the first and second maximum emission wavelengths comprises a wavelength at which an emission intensity of the blue light is highest.

Another aspect of the invention provides a flat panel display comprising the device described above. The flat panel display may comprise an organic light emitting display. The flat panel display may comprise at least one thin film transistor comprising a source electrode and a drain electrode, and one of the first and second electrodes may be electrically connected to one of the source electrode and drain electrode.

Another aspect of the invention provides a method of operating the device described above. The method comprises: stimulating the second blue emission layer so as to generate blue light from the second blue emission layer; and permitting the blue light from the second blue emission layer to pass through the first blue emission layer, wherein the blue light from the second blue emission layer supplies at least part of energy for generating blue light from the first blue emission layer.

Another aspect of the invention provides an organic light emitting device (OLED) which can emit blue light while having high efficiency and high brightness, and a flat display including the OLED.

Another aspect of the invention provides an organic light emitting device including an organic layer which includes a pixel electrode, an opposite electrode, and at least an emission layer between the pixel electrode and the opposite electrode, wherein the emission layer includes a long wavelength-blue emission layer emitting blue light having a long wavelength and a short wavelength-blue emission layer emitting blue light having a short wavelength, and the long wavelength-blue emission layer is positioned in a location to enhance emission of blue light from the emission layer.

Yet another aspect of the invention provides a flat display including the OLED as described above.

BRIEF DESCRIPTION OF THE DRAWINGS

The above and other aspects of the invention will become more apparent by describing in detail exemplary embodiments thereof with reference to the attached drawings in which.

DETAILED DESCRIPTION OF CERTAIN INVENTIVE EMBODIMENTS

The instant disclosure will now be described more fully with reference to the accompanying drawings, in which exemplary embodiments are shown. The invention may, however, be embodied in many different forms and should not be construed as being limited to the embodiments set forth herein.

An organic light emitting device (OLED) according to an embodiment includes a pixel electrode, an opposite electrode, and at least one emission layer (EML) between the pixel electrode and the opposite electrode. The EML includes a long wavelength-blue EML emitting blue light having a relatively long wavelength, and a short wavelength-blue EML emitting blue light having a relatively short wavelength. The long wavelength-blue EML is positioned at a location to enhance emission of blue light from the EML.

The OLED according to the present embodiment includes both the long-wavelength blue EML and the short wavelength blue EML. Throughout this specification, the term "long wavelength-blue EML" refers to an EML emitting blue light having a relatively long wavelength. The term "short wavelength-blue EML," as used herein, refers to an EML emitting blue light having a relatively short wavelength. In the context of this document, to distinguish between the two EMLs emitting blue light having different emission properties from each other, the EML emitting blue light, of which maximum emission wavelength is relatively long, is called "long wavelength-blue EML" whereas the EML emitting blue light, of which maximum emission wavelength is relatively short, is called "short wavelength-blue EML." That is, throughout this specification, the terms "long wavelength-blue EML" and "short wavelength-blue EML" are used to indicate a relative relationship between the two EMLs emitting blue light having different emission properties from each other.

The OLED according to another embodiment includes both the long wavelength-blue EML and the short wavelength-blue EML. The long wavelength-blue EML is positioned in a location to enhance emission of blue light from the EML.

In one embodiment, the pixel electrode may include a transparent material and the opposite electrode may include a reflective material. Thus, in such an OLED (for example, a bottom emission type OLED), blue light emits from an EML through the pixel electrode. In this embodiment, elements included in the OLED can be sequentially stacked in an order of the pixel electrode, the long wavelength-blue EML, the short wavelength-blue EML and the opposite electrode.

In another embodiment, the pixel electrode may include a reflective material and the opposite electrode may include a transparent material. Thus, in such an OLED (for example, top emission type OLED), blue light emits from an EML through the opposite electrode. Elements included in the OLED can be sequentially stacked in an order of the pixel electrode, the short wavelength-blue EML, the long wavelength-blue EML and the opposite electrode.

Alternatively, both the pixel electrode and the opposite electrode may include transparent materials. Thus, in an OLED (for example, a double-side emission type OLED), blue light emits from an EML through both the pixel electrode and the opposite electrode. Elements included in the OLED can be sequentially stacked in order of the pixel electrode, a first long wavelength-blue EML, the short wavelength-blue EML, a second long wavelength-blue EML and the opposite electrode. Here, wavelengths of blue light emitted from the first long wavelength-blue EML and second long wavelength-blue EML may be identical or different. The wavelengths of blue light emitted from the first long wavelength-blue EML and second long wavelength-blue EML are longer than a wavelength of blue light emitted from the short wavelength-blue EML.

As described above, the OLED described above includes the long wavelength-blue EML configured to enhance emission of blue light from the EML, and thus the OLED can emit blue light having a high efficiency and a high brightness.

When an electrical field is applied to the OLED, both the long wavelength-blue EML and the short wavelength-blue EML emit blue light according to electroluminescence mechanisms, and blue light emitting from the short wavelength-blue EML passes through the long wavelength-blue EML. Accordingly, an additional emission of light from the long wavelength-blue EML can be induced by the blue light emitted from the short wavelength-blue EML according to photoluminescence mechanisms. That is, in the long wavelength-blue EML included in the OLED according to an embodiment, an emission of light by applying electrical fields (electroluminescence) and an emission of light induced by blue light emitted from the short wavelength-blue EML (photoluminescence) can occur, and thus the OLED according to an embodiment can emit blue light having a maximized emission efficiency and brightness. In particular, only about 25% of input energy can be converted to light according to electroluminescence mechanisms. On the other hand, about 100% of input energy can be converted to light according to photoluminescence mechanisms. In addition, in the OLED including the long wavelength-blue EML and the short wavelength-blue EML according to an embodiment, an intensity of radiation emitted from the long wavelength-blue EML and an intensity of radiation emitted from the short wavelength-blue EML can be adjusted to have a ratio between about 6:4 and about 7:3. Thus, the OLEDs according to the embodiments can emit blue light having a high efficiency and a high brightness.

As described above, the wavelengths of blue light emitted from the long wavelength-blue EML and the short wavelength-blue EML are relative. In one embodiment, the maximum emission wavelength of blue light emitted from the long wavelength-blue EML may be, for example, in the range of about 470 nm to about 500 nm. The maximum emission wavelength of blue light emitted from the short wavelength-blue EML may be, for example, in the range of about 440 nm to about 470 nm.

The thicknesses of the long wavelength-blue EML and the short wavelength-blue EML can vary depending on the compositions of materials used to form the long wavelength-blue EML and the short wavelength-blue EML respectively. In one embodiment, each of EMLs may have a thickness between about 5 nm and about 250 mm. When the thickness of the long wavelength-blue EML and the short wavelength-blue EML is about 5 nm or greater, although not necessarily limited thereto, an OLED may have an enough efficiency and brightness. When the thickness of the long wavelength-blue EML and the short wavelength-blue EML is about 250 nm or less, although not necessarily limited thereto, an OLED may have an appropriate driving voltage.

The long wavelength-blue EML and the short wavelength-blue EML may include blue light emitting materials only. In other embodiments, the long wavelength-blue EML and the short wavelength-blue EML may include a mixture of a host and blue dopant. When the mixture of the host and blue dopant is used, the blue dopant may be in an amount of about 0.01 to about 15 parts by weight based on 100 parts by weight of the host. The blue dopant may include a phosphorescence dopant and/or a phosphor dopant. It will be appreciated by those of ordinary skill in the art that various kinds of blue dopants and hosts may be adapted for the blue EML.

For example, the long wavelength-blue EML may include tetra(t-butyl)perylene (TBPe), bis(4,6-difluorophenyl-pyridine)iridium picolinate (FIrpic). or the like as a dopant, but examples of the dopant are not limited thereto. The long wavelength-blue EML may include distyrylanthracene (DSA), 4,4'-bis((carbazol-9-yl)-biphenyl (CBP)), or the like as a host, however examples of the host are not limited thereto.

The short wavelength-blue EML may include anthracene-dipenylamine (DSAamine), compounds represented by Formula 1 below, compounds represented by Formula 2 below, or the like as a dopant, however examples of the dopant are not limited thereto.

Formula 1

Formula 2

Detailed descriptions of the compounds represented by Formula 1 and the compounds represented by Formula 2 are disclosed in Korean Patent Application Publication No. 2005-0121865 and Korean Patent No. 0537621.

In one embodiment, the short wavelength-blue EML may include distyrylanthracene (DSA), 4,4'-bis((carbazol-9-yl)-biphenyl (CBP)), or the like as a host, however examples of the host are not limited thereto.

The organic layer of the OLED as described above may further include at least one layer selected from the group consisting of a hole injection layer (HIL), a hole transport layer (HTL), an electron blocking layer (EBL), a hole blocking layer (HBL), an electron transport layer (ETL) and an electron injection layer (EIL).

Figure 1A:
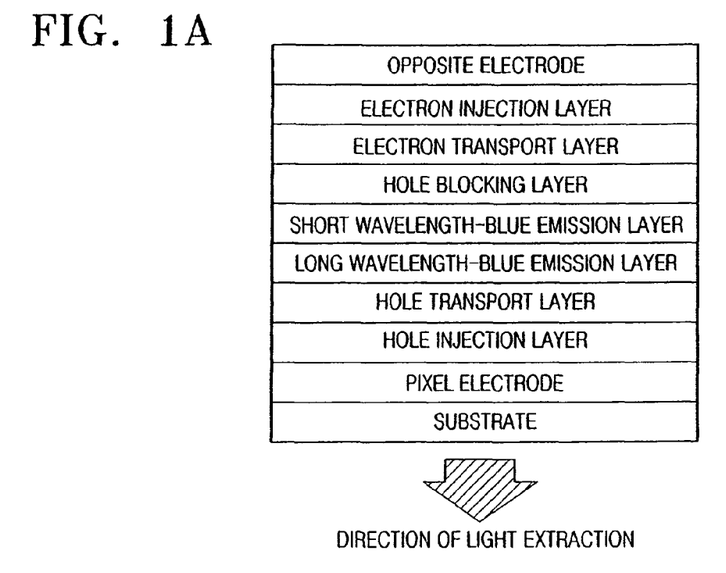
FIGS. 1A, 1B and 1C are schematic cross-sectional views illustrating an organic light emitting device (OLED) according to embodiments.

FIG. 1A is a schematic cross-sectional view illustrating an OLED according to an embodiment. Referring to FIG. 1A, light emitting from an EML travels through a pixel electrode. In the illustrated embodiment, the pixel electrode, a HIL, a HTL, a long wavelength-blue EML, a short wavelength-blue EML, a HBL, an ETL, an EIL and an opposite electrode are stacked sequentially.

Figure 1B:
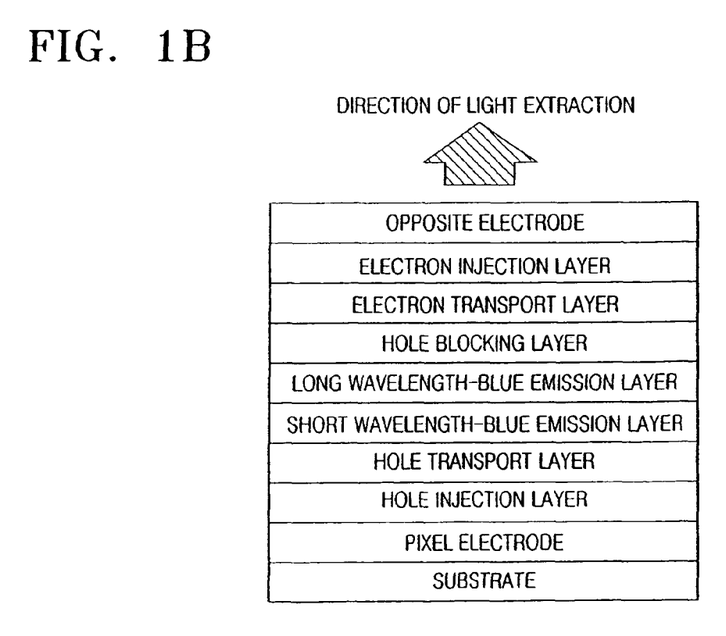

FIG. 1B is a schematic cross-sectional view illustrating an OLED according to another embodiment. Referring to FIG. 1B, light emitting from an EML travels through an opposite electrode. In the illustrated embodiment, a pixel electrode, a HIL, a HTL, a short wavelength-blue EML, a long wavelength-blue EML, a HBL, an ETL, an EIL and the opposite electrode are stacked sequentially.

Figure 1C:
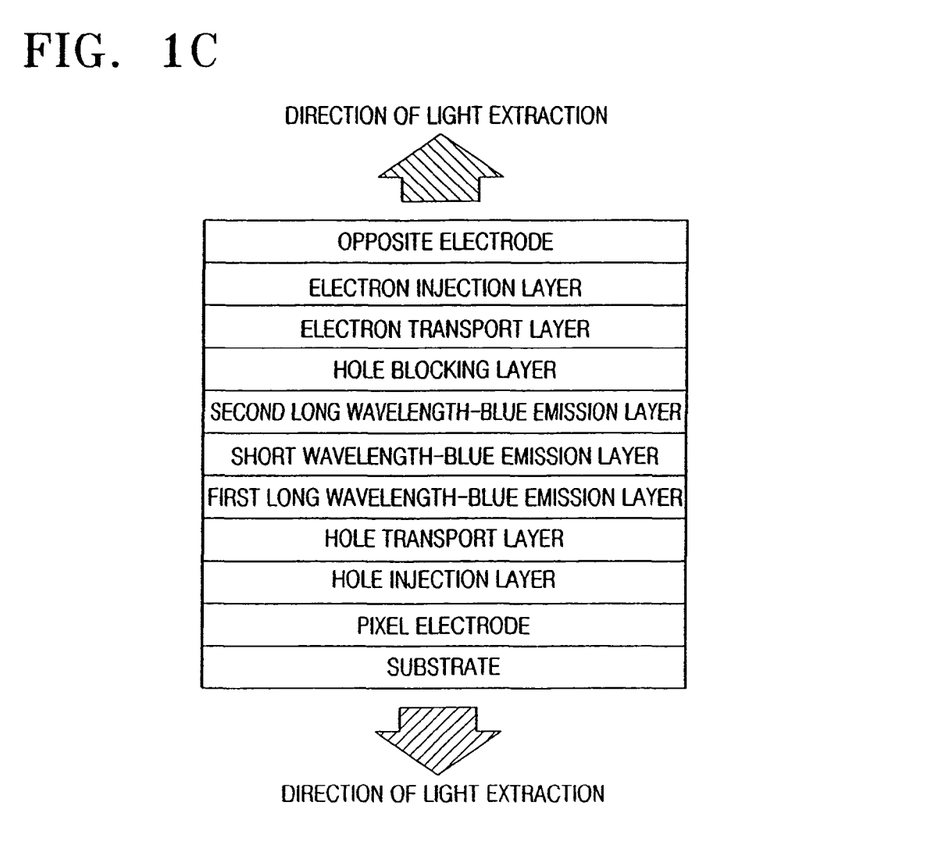

FIG. 1B is a schematic cross-sectional view illustrating an OLED according to another embodiment. Referring to FIG. 1C, light emitting from an EML travels through both a pixel electrode and an opposite electrode. In the illustrated embodiment, the pixel electrode, a HIL, a HTL, a first long wavelength-blue EML, a short wavelength-blue EML, a second long wavelength-blue EML, a HBL, an ETL, an EIL and the opposite electrode are stacked sequentially. It will be understood by those of ordinary skill in the art that various changes may be made without departing from the spirit and scope of the invention.

Hereinafter, a method of manufacturing the OLED according to an embodiment will be described with reference to FIG. 1A. First, a pixel electrode is formed on a substrate. Here, the substrate may be any suitable substrate used for OLEDs. In certain embodiments, the substrate may be a glass substrate or a plastic substrate depending on desired characteristics of the substrate such as transparency, surface smoothness, water resistance, or the like. The pixel electrode may be a transparent electrode including a metal having an excellent conductivity. Examples of the metal includes, but are not limited to, lithium (Li), magnesium (Mg), aluminum (Al), aluminum-lithium (Al—Li), calcium (Ca), magnesium-indium (Mg—In), magnesium-silver (Mg—Ag), calcium (Ca)-aluminum (Al), aluminum (Al)-ITO, ITO, and IZO. In the OLED in which light emitting from the EML travels through the opposite electrode, the pixel electrode may be a reflective electrode including a metal having an excellent conductivity as described above. It will be understood by those of ordinary skill in the art that various changes may be made without departing from the spirit and scope of the invention.

Next, a HIL is formed on the pixel electrode using any suitable method. Examples of such method include, but are not limited to, a vacuum evaporation method, a spin coating method, a casting method, and a Langmuir-Blodgett (LB) method.

When the HIL is formed using a vacuum evaporation method, deposition conditions can be varied according to compounds used as a material to form the HIL, and the structure and thermal properties of the HIL, or the like. The deposition conditions may include a deposition temperature of about 100° C. to about 500° C., a degree of a vacuum of about $10^{-8}$ to about $10^{-3}$ torr, and a deposition velocity of about 0.01 to about 100 Å/sec.

When the HIL is formed in a vacuum using a spin coating method, coating conditions can be varied according to compounds used as a material to form the HIL, and the structure and thermal properties of the HIL, or the like. The coating conditions may include a coating velocity of about 2000 to about 5000 rpm, and a heat treatment temperature of about 80 to about 200° C. for removing a solvent after coating.

The materials of the HIL may be selected from any suitable hole injection materials which are known to those of ordinary skill in the art, but are not limited thereto. Examples of the hole injection materials include, but are not limited to, triphenylamine (TCTA), m-MTDATA, Polyaniline/Dodecylbenzenesulfonic acid (Pani/DBSA) and Poly(3,4-ethylenedioxythiophene)/Poly(4-styrenesulfonate) (PEDOT/PSS) which are amines having type of copper phthalocyanine (CuPc) or Starburst, or the like. In one embodiment, the thickness of the HIL may be from about 5 to about 150 nm. When the thickness of the HIL is about 5 nm or greater, although not necessarily limited thereto, a proper hole injection properties may be provided. When the thickness of the HIL is about 150 nm or less, although not necessarily limited thereto, an OLED may have an appropriate driving voltage.

Next, a HTL may be formed on the HIL using various methods such as a vacuum evaporation method, a spin coating method, a casting method, a LB method, or the like. When the HTL is formed using a vacuum evaporation method or a spin coating method, deposition conditions and coating conditions may be varied depending on compounds used as a material to form the HTL. In certain embodiments, the deposition conditions and the coating conditions may be substantially the same as deposition conditions and coating conditions of the HIL.

The material used to form the HTL may be selected from hole transport materials which are known to those of ordinary skill in the art, but are not limited thereto. Examples of the hole transport materials include 1,3,5-tricarbazolylbenzene, 4,4'-bis carbazolylbiphenyl, polyvinylcarbazole, m-biscarbazolyl phenyl, 4,4'-bis carbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di(naphthalene-1-il)-N,N'-diphenyl benzidine (NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenyl amine) (TFB) and poly(9,9-dioctylfluorene-co-bis-(4-butylphenyl-bis-N,N-phenyl-1,4-phenylenediamin)) (PFB), and the like, but are not limited thereto. In one embodiment, the thickness of the HTL may be from about 5 to about 150 nm. When the thickness of the HTL is about 5 nm or greater, although not necessarily limited thereto, a proper hole transport properties may be provided. When the thickness of the HTL is about 150 nm or less, although not necessarily limited thereto, an OLED may have an appropriate driving voltage.

Next, a long wavelength-blue EML and a short wavelength-blue EML are formed sequentially using a method such as a vacuum evaporation method, a spin coating method, a casting method, a LB method, or the like. When the HTL is formed using a vacuum evaporation method or a spin coating method, deposition conditions and coating conditions can be varied depending on compounds used as a material for forming the HTL. In certain embodiments, the deposition conditions and the coating conditions may be substantially the same deposition conditions and coating conditions as for the HIL. The thicknesses and materials of the long wavelength-blue EML and short wavelength-blue EML may be as described above with respect to those of the above embodiments.

A HBL may be formed on the short wavelength-blue EML using various methods such as a vacuum evaporation method, a spin coating method, a casting method, a LB method, or the like. When the HBL is formed using a vacuum evaporation method or a spin coating method, deposition conditions and coating conditions can be varied depending on compounds used as a material to form the HBL. In certain embodiments, the deposition conditions and the coating conditions may be substantially the same deposition conditions and coating conditions as the HIL.

The materials used to form the HBL are not limited to specific materials, but the materials of the HBL have electron transport abilities and a higher ionization potential than an ionization potential of emitting compounds. Examples of the materials that can be used to form the HBL are bis(2-methyl-8-quinolato)-(p-phenylphenolato)-aluminum (Balq), bathocuproine (BCP), tris(N-arylbenzimidazole) (TPBI), and the like. In one embodiment, the thickness of the HBL may be from about 1 to about 10 nm. When the thickness of the HBL is about 1 nm or greater, although not necessarily limited thereto, a proper hole blocking effect may be provided. When the thickness of the HBL is about 10 nm or less, although not necessarily limited thereto, an OLED may have an appropriate driving voltage.

An ETL may be formed on the HBL using various methods such as a vacuum evaporation method, a spin coating method, a casting method, an LB method, or the like. When the ETL is formed using a vacuum evaporation method or a spin coating method, deposition conditions and coating conditions can be varied depending on compounds used as a material to form the ETL. In certain embodiments, the deposition conditions and the coating conditions used to form the ETL may be substantially the same deposition conditions and coating conditions ranges as for the HIL. Electron transport materials may be Alq3, or the like, but are not limited thereto. In one embodiment, the thickness of the ETL may be from about 10 to about 40 nm. When the thickness of the ETL is about 10 nm or greater, although not necessarily limited thereto, a proper electron transport velocities may be provided to create a charge balance. When the thickness of the ETL is about 40 nm or less, although not necessarily limited thereto, an OLED may have an appropriate driving voltage.

An EIL may be formed on the ETL using various methods such as a vacuum evaporation method, a spin coating method, a casting method, a LB method. When the EIL is formed using a vacuum evaporation method or a spin coating method, deposition conditions and coating conditions can be varied depending on compounds used as a material to form the EIL. In certain embodiments, the deposition conditions and the coating conditions used to form the EIL may be substantially the same deposition conditions and coating conditions as for the HIL.

The materials used to form the EWL may be BaF2, LiF, NaCl, CsF, Li$_2$O, BaO, Liq, or the like, but are not limited thereto. Liq is represented by the following Formula 3.

Formula 3

Liq

In one embodiment, the thickness of the EIL may be from about 0.2 to about 10 nm. When the thickness of the EIL is about 0.2 nm or greater, although not necessarily limited thereto, an effective EIL may be provided. When the thickness of the EIL is about 10 nm or less, although not necessarily limited thereto, an OLED may have an appropriate driving voltage.

Next, an opposite electrode is formed on the EIL, thereby completing manufacture of an OLED. The opposite electrode may comprise a film including lithium (Li), magnesium (Mg), aluminum (Al), aluminum-lithium (Al—Li), calcium (Ca), magnesium-indium (Mg—In), magnesium-silver (Mg—Ag), calcium (Ca)-aluminum (Al), or the like to be a reflective electrode. In addition, in the OLED illustrated in FIG. 1B, light emitting from the EML travels through the opposite electrode. In the illustrated embodiment, the opposite electrode may be a transparent metal oxide having an excellent conductivity such as indium tin oxide (ITO), indium zinc oxide (IZO), tin oxide (SnO2), zinc oxide (ZnO), or the like. It will be understood by those of ordinary skill in the art that various changes may be made to the opposite electrode. The pixel electrode and the opposite electrode can serve as an anode and a cathode respectively, or vice versa.

While the OLED according to an embodiment and the method of manufacturing the OLED have been shown and described with reference to FIG. 1A, it will be understood by those of ordinary skill in the art that the structure of the OLED is not limited to the structure illustrated in FIG. 1A.

The OLED according to the embodiments described above may apply to a flat display of various types, for example, passive matrix organic light emitting display devices and active matrix organic light emitting display devices. In particular, when the OLED according to the embodiments applies to active matrix organic light emitting display devices, the pixel electrode may be electrically connected to a source electrode or a drain electrode of a thin film transistor included in the active matrix organic light emitting display devices.

Hereinafter, the instant disclosure will be described in greater detail with reference to the following examples. The following examples are for illustrative purposes only and are not intended to limit the scope of the invention.

EXAMPLE 1

First, a DSA+3 wt % TBPe film (the long wavelength-blue EML according to an embodiment), a DSA+3 wt % DSAamine film (the short wavelength-blue EML according to an embodiment), and a combination of a DSA+3 wt % TBPe film and a DSA+3 wt % DSAamine (a combination of the long wavelength-blue EML and the short wavelength-blue EML according to an embodiment) were prepared. Emission properties of the prepared materials were evaluated.

Three quartz substrates were prepared. Each was washed using chloroform and demi water. After DSA (available from Samsung SDI Co., Ltd., Suwon, Korea), TBPe (available from Samsung SDI Co., Ltd.) and DSAamine (available from Samsung SDI Co., Ltd.) were each prepared, DSA and TBPe were deposited on a first one of the quartz substrates so that an amount of TBPe might be 3 parts by weight based on 100 parts by weight of DSA. Thereby, a DSA+3 wt % TBPe film having a thickness of 15 nm was prepared. Hereinafter, this film is referred to as "Film 1."

Meanwhile, DSA and DSAamine were deposited on a second quartz substrate so that an amount of DSAamine might be 3 parts by weight based on 100 parts by weight of DSA. Thereby, a DSA+3 wt % DSAamine film having a thickness of 15 nm was prepared. Hereinafter, this film is referred to as "Film 2."

Finally, DSA and TBPe were deposited on a third quartz substrate so that an amount of TBPe might be 3 parts by weight based on 100 parts by weight of DSA. Thereby, a DSA+3 wt % TBPe film having a thickness of 15 nm was prepared. Next, DSA and DSAamine were deposited on the DSA+3 wt % TBPe film so that an amount of DSAamine might be 3 parts by weight based on 100 parts by weight of DSA. Thereby, a DSA+3 wt % DSAamine film having a thickness of 15 nm on the DSA+3 wt % TBPe film was further prepared. Hereinafter, this film is referred to as "Film 3."

Figure 2A:
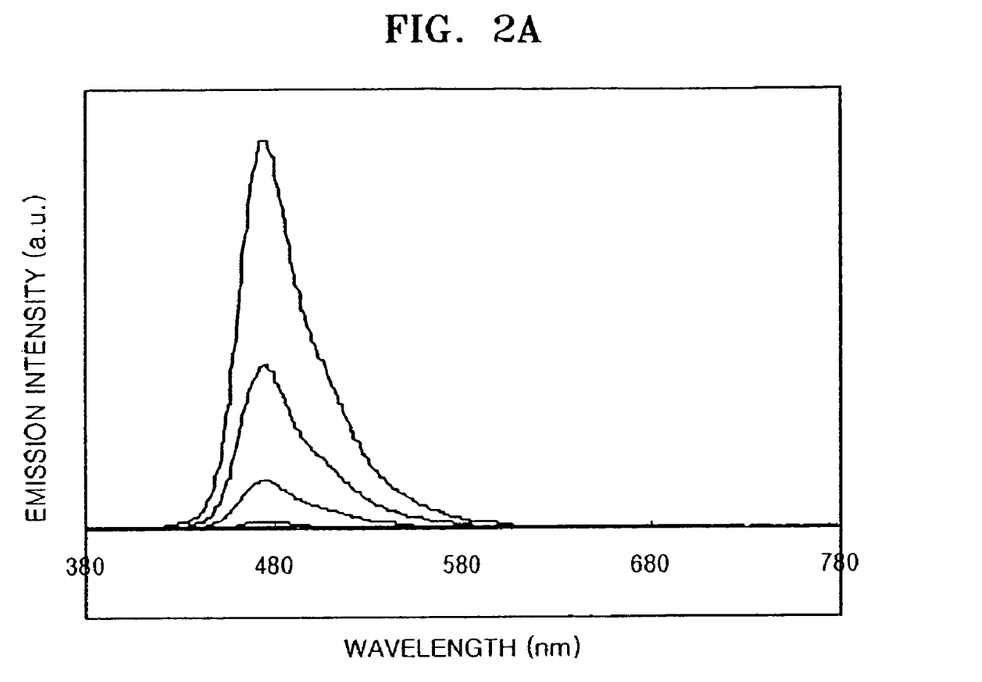
FIGS. 2A, 2B and 2C are graphs illustrating photoluminescent (PL) spectra of a long wavelength-blue EML, a short wavelength-blue EML and a combination of long wavelength-blue EML/short wavelength-blue EML, respectively, according to embodiments.
Figure 2B:
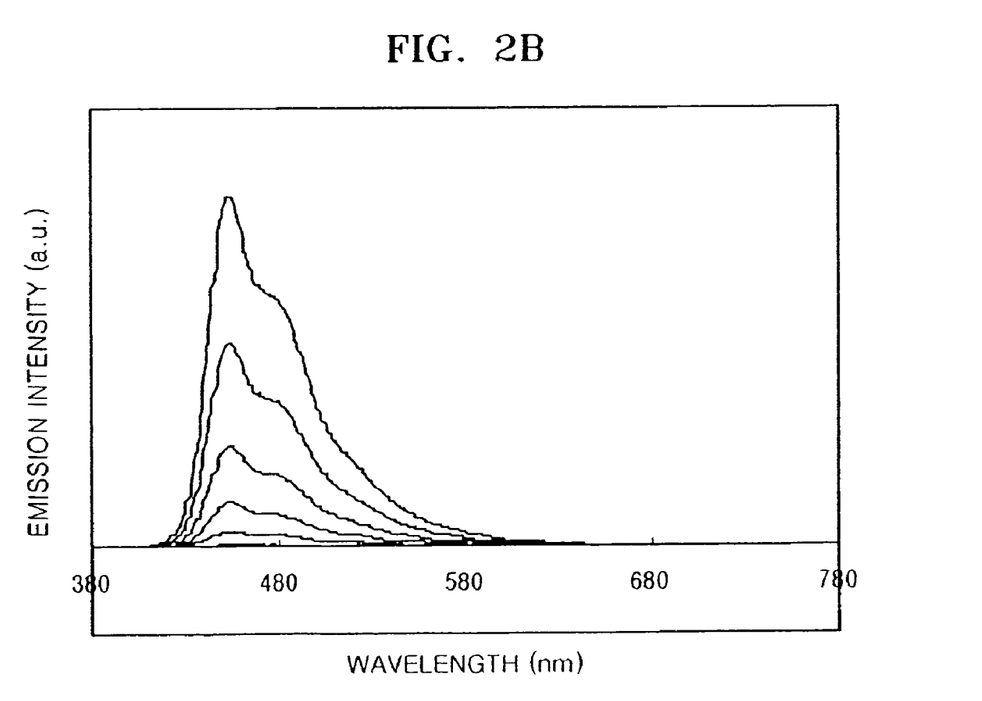
Figure 2C:
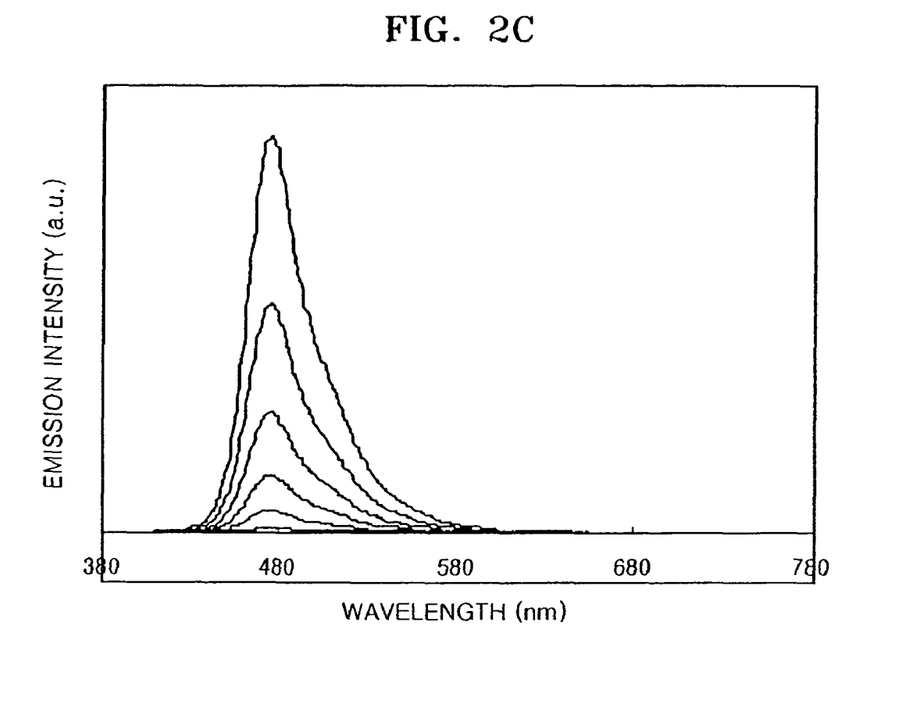

Photolumineçscence (PL) spectrums of Films 1, 2 and 3 were measured using a JASCO FP-6500 spectrofluorometer (available from Jasco, Inc., Easton, Md.) having a xenon lamp, and measured results are illustrated in FIGS. 2A, 2B and 2C.

Referring to FIG. 2A, a maximum emission wavelength of Film 1 was about 480 nm. Referring to FIG. 2B, a maximum emission wavelength of Film 2 was about 460 nm. Referring to FIG. 2C, a maximum emission wavelength of Film 3 was about 480 nm.

EXAMPLE 2

A device including a long wavelength-blue EML and a short wavelength-blue EML formed on the long wavelength-blue EML, was manufactured to have the following structure: a pixel electrode (ITO)/a HIL (CuPc) 60 nm/a HTL (NPD) 30 nm/the long wavelength-blue EML (DSA+3 wt % TBPe) 15 nm/the short wavelength-blue EML (DSA+3 wt % DSAamine) 15 nm/a HBL (Balq) 5 nm/an ETL (Alq3) 20 nm/an opposite electrode (Al). The device included a transparent electrode as the pixel electrode and a reflective electrode as the opposite electrode, and thus blue light was emitted from the EML through the pixel electrode.

First, a 15Ω/cm$^2$ (1000 Å) ITO glass substrate as a transparent pixel electrode was cut to have a size of 50 mm×50 mm×0.7 mm. After being ultrasonic-cleaned in acetone isopropyl alcohol and demi water for fifteen minutes, the substrate was UV and ozone-washed for thirty minutes.

CuPc constituting a hole injection material was deposited on the pixel electrode to form the HIL having a thickness of 60 nm. NPD constituting a hole transport material was deposited on the HIL to form the HTL having a thickness of 30 nm.

DSA (available from Samsung SDI Co., Ltd., Suwon, Republic of Korea) and TBPe (available from Samsung SDI Co., Ltd.) were deposited on the HTL (here, an amount of TBPe was 3 parts by weight based on 100 parts by weight of DSA) to form the long wavelength-blue EML having a thickness of 15 nm. DSA (available from Samsung SDI Co., Ltd.) and DSAamine (available from Samsung SDI Co., Ltd.) were deposited on the long wavelength-blue EML (here, an amount of DSAamine was 3 parts by weight based on 100 parts by weight of DSA 100) to form the short wavelength-blue EML having a thickness of 15 nm.

After, Balq was deposited on the short wavelength-blue EML to form the HBL having a thickness of 5 nm, Alq3 was deposited on the HBL to form the ETL having a thickness of 20 nm. Next, Al was deposited on the ETL to form the opposite electrode, thereby completing manufacture of an OLED. Hereinafter, this OLED is referred to as "Sample 1."

EXAMPLE 3

An OLED was manufactured using the same method as example except that a blue EML (DSA+3 wt % TBPe) having a thickness of 30 nm was formed and a HBL was formed on the blue EML (DSA+3 wt % TBPe) instead of a short wavelength-blue EML being formed. The OLED had a structure of: a pixel electrode (ITO)/a HIL (CuPc) 60 nm/a HTL (NPD) 30 nm/a long wavelength-blue EML (DSA+3 wt % TBPe) 30 nm/a HBL (Balq) 5 nm/an ETL (Alq3) 20 nm/an opposite electrode (Al). Hereinafter, this OLED is called "Sample A."

EXAMPLE 4

With respect to Samples 1 and A, driving voltages, current intensities, brightnesses, current efficiencies, power efficiencies, color coordinates and external quantum efficiencies were measured using a PR650 (Spectroscan) Source Measurement Unit (available from Photo Research, Inc., Chatsworth, Calif.). These results are shown in Table 1:

TABLE 1

| Sample No. | Driving voltage (V) | Current intensity (mA/cm$^2$) | brightness (cd/m$^2$) | Current efficiency (cd/A) | Power efficiency (lm/W) | x value | y value |
| --- | --- | --- | --- | --- | --- | --- | --- |
| Sample 1 | 7.5 | 80 | 7000 | 8.7 | 3.6 | 0.14 | 0.23 |
| Sample A | 7.5 | 80 | 5800 | 7.2 | 3.0 | 0.14 | 0.23 |

Figure 3:
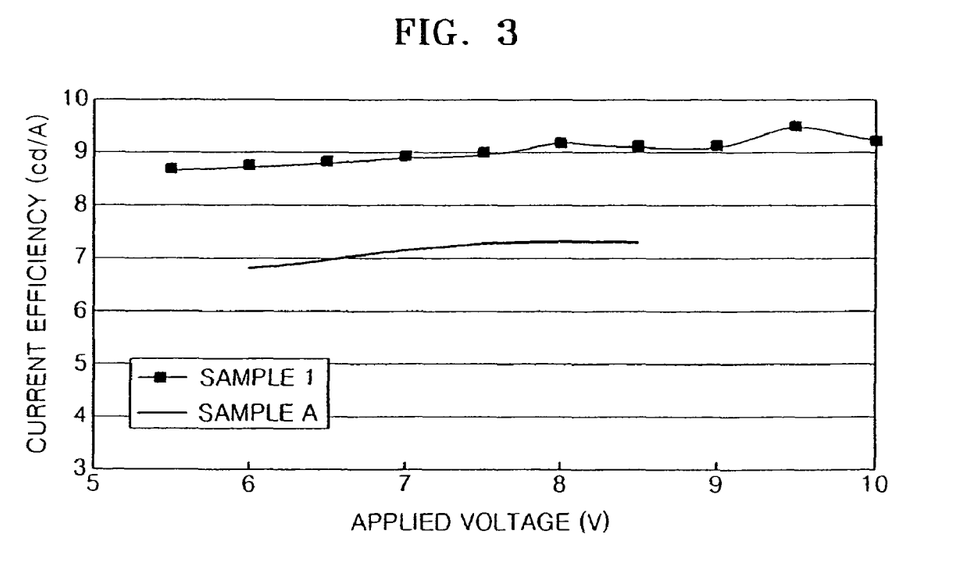
FIG. 3 is a graph illustrating current efficiency of an OLED according to an embodiment.
Figure 4:
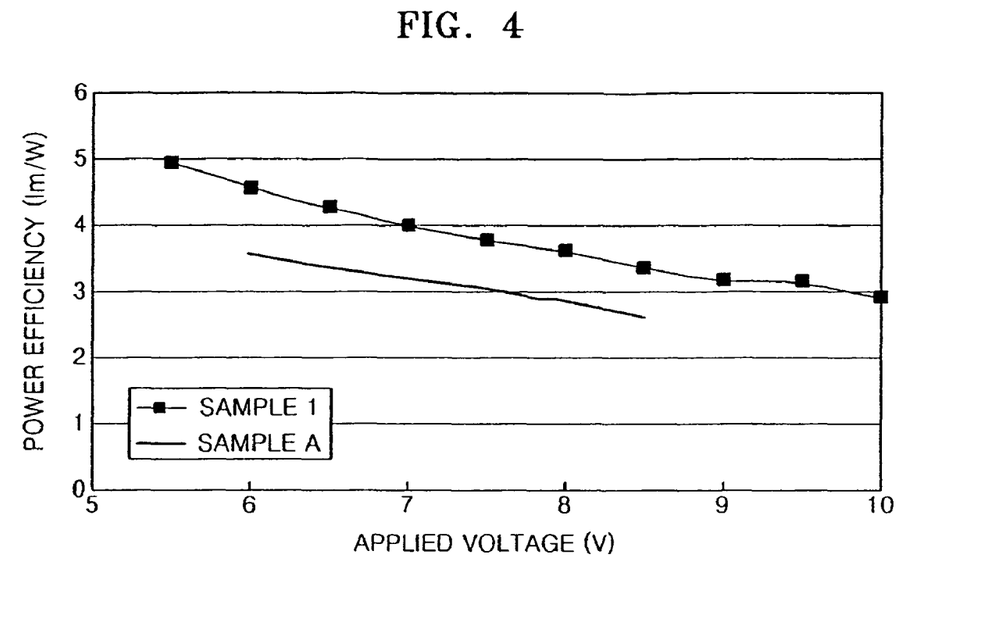
FIG. 4 is a graph illustrating power efficiency of an OLED according to an embodiment.
Figure 5:
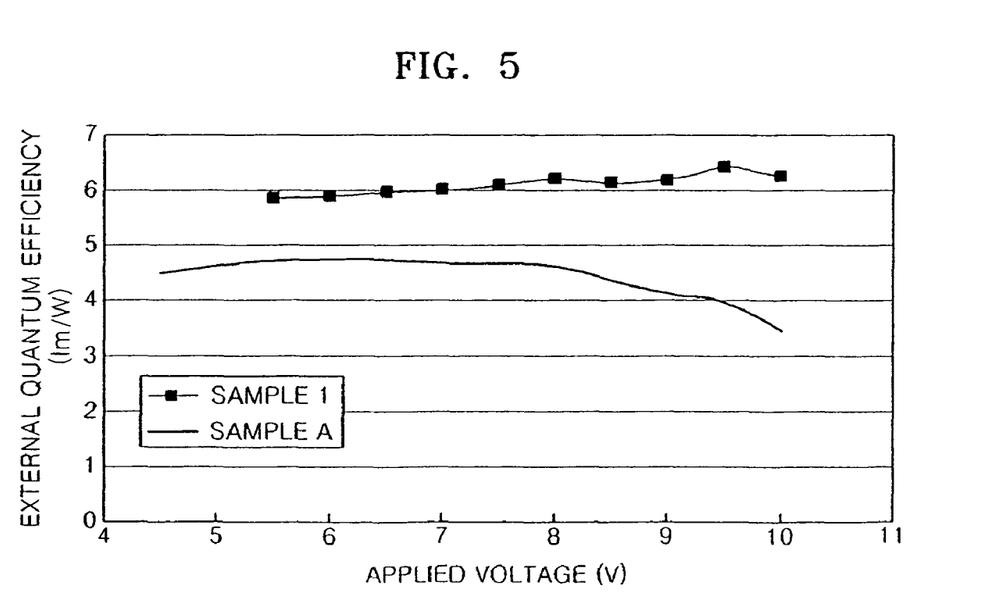
FIG. 5 is a graph illustrating external quantum efficiency of an OLED according to an embodiment.

In particular, the current efficiencies and the power efficiencies of Samples 1 and A are shown in more detail in FIGS. 3 and 4, and the external quantum efficiencies Samples 1 and A are shown in more detail in FIG. 5.

Referring to Table 1, and FIGS. 3, 4 and 5, the OLED according to the embodiments has high brightness, high current efficiency, high power efficiency, and high external quantum efficiency without degradations of driving voltages and color purities compared with a conventional OLED.

The OLED according to the embodiments includes a long wavelength-blue EML and a short wavelength-blue EML, wherein the long wavelength-blue EML is positioned in a location to enhance emission of blue light from the EML. Accordingly, the OLED according to the embodiments can emit blue light having a maximized emission efficiency and brightness, and thus the flat display including the OLED has improved reliability.

While the instant disclosure has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An organic light emitting device, comprising:
    a first electrode comprising a substantially transparent conductor;
    a second electrode;
    a first blue emission layer interposed between the first and second electrodes, the first blue emission layer comprising a first compound configured to emit blue light having a first maximum emission wavelength; and
    a second blue emission layer interposed between the first blue emission layer and the second electrode, the second blue emission layer comprising a second compound configured to emit blue light having a second maximum emission wavelength, the second maximum emission wavelength being shorter than the first maximum emission wavelength;
    wherein both the first compound and second compound are a phosphorescent dopant or both the first compound and second compound are a phosphor dopant.

2. The device of claim 1, wherein the first electrode comprises an anode electrode, and wherein the second electrode comprises a cathode electrode, the second electrode comprising a reflective conductor.

3. The device of claim 1, wherein the first electrode comprises a cathode electrode, and wherein the second electrode comprises an anode electrode, the second electrode comprising a reflective conductor.

4. The device of claim 1, wherein the second electrode comprises a substantially transparent conductor, and wherein the device further comprises a third blue emission layer interposed between the second electrode and the second blue emission layer, the third blue emission layer comprising a third compound configured to emit blue light having a third maximum emission wavelength, the third maximum emission wavelength being longer than the second maximum emission wavelength.

5. The device of claim 4, wherein the third maximum emission wavelength is substantially the same as the first maximum emission wavelength.

6. The device of claim 4, wherein the third blue emission layer comprises the first compound.

7. The device of claim 1, wherein the first maximum emission wavelength is between about 470 nm and about 500 nm.

8. The device of claim 1, wherein the second maximum emission wavelength is between about 440 nm and about 470 nm.

9. The device of claim 1, wherein the first blue emission layer has a thickness between about 5 nm and about 250 nm.

10. The device of claim 1, wherein the second blue emission layer has a thickness between about 5 nm and about 250 nm.

11. The device of claim 1, wherein the first blue emission layer comprises at least one material selected from the group consisting of tetra(t-butyl)perylene and bis(4,6-difluorophenyl-pyridine)iridium picolinate (FIrpic).

12. The device of claim 1, wherein the second blue emission layer comprises at least one material selected from the group consisting of anthracenediphenylamine, the compound represented by Formula 1 and the compound represented by Formula 2:

Formula 1

Formula 2

13. The device of claim 1, further comprising at least one layer interposed between the first electrode and the second electrode, the at least one layer being selected from the group consisting of a hole injection layer, a hole transport layer, an electron blocking layer, a hole blocking layer, an electron transport layer and an electron injection layer.

14. The device of claim 1, wherein each of the first and second maximum emission wavelengths comprises a wavelength at which an emission intensity of the blue light is highest.

15. A flat panel display comprising the device of claim 1.

16. The flat panel display of claim 15, wherein the display comprises an organic light emitting display.

17. The flat panel display of claim 15, wherein the flat panel display comprises at least one thin film transistor comprising a source electrode and a drain electrode, and wherein one of the first and second electrodes is electrically connected to one of the source electrode and drain electrode.

18. A method of operating the device of claim 1, the method comprising:
applying an electrical field between the first and second electrodes such that the first and second blue emission layers emit blue light; and
permitting the blue light from the second blue emission layer to pass through the first blue emission layer, wherein the blue light from the second blue emission layer induces the first blue emission layer to further generate blue light.

19. The device of claim 1, wherein both the first compound and second compound are a phosphor dopant.

20. The device of claim 1, wherein the first blue emission layer comprises tetra(t-butyl)perylene (TBPe) and the second blue emission layer comprises anthracenediphenylamine (DSAamine).

21. An organic light emitting device, comprising:
a first electrode comprising a substantially transparent conductor;
a second electrode;
a first blue emission layer interposed between the first and second electrodes, the first blue emission layer comprising a first compound configured to emit blue light having a first maximum emission wavelength; and
a second blue emission layer interposed between the first blue emission layer and the second electrode, the second blue emission layer comprising a second compound configured to emit blue light having a second maximum emission wavelength, the second maximum emission wavelength being shorter than the first maximum emission wavelength;
wherein the second blue emission layer comprises at least one material selected from the group consisting of the compound represented by Formula 1 and the compound represented by Formula 2:

Formula 1

Formula 2

* * * * *